United States Patent
Ma et al.

(10) Patent No.: US 9,818,967 B2
(45) Date of Patent: Nov. 14, 2017

(54) BARRIER COVERED MICROLENS FILMS

(71) Applicant: Universal Display Corporation, Ewing, NJ (US)

(72) Inventors: Ruiqing Ma, Morristown, NJ (US); Julia J. Brown, Yardley, PA (US); Michael Hack, Princeton, NJ (US); Siddharth Harikrishna Mohan, Plainsboro, NJ (US); Gregory McGraw, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/930,229

(22) Filed: Jun. 28, 2013

(65) Prior Publication Data
US 2015/0001470 A1    Jan. 1, 2015

(51) Int. Cl.
| | |
|---|---|
| *H01L 51/52* | (2006.01) |
| *G02B 1/14* | (2015.01) |
| *H01L 51/56* | (2006.01) |
| *G02B 1/10* | (2015.01) |
| *G02B 3/00* | (2006.01) |

(52) U.S. Cl.
CPC .............. *H01L 51/52* (2013.01); *G02B 1/105* (2013.01); *G02B 1/14* (2015.01); *G02B 3/0006* (2013.01); *H01L 51/5275* (2013.01); *H01L 51/56* (2013.01)

(58) Field of Classification Search
CPC ................................ G06F 3/0488; G06F 3/044
USPC ...................... 257/59, 72; 345/173
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |

(Continued)

FOREIGN PATENT DOCUMENTS

| | | |
|---|---|---|
| EP | 2495783 A1 | 9/2012 |
| WO | 2008057394 | 5/2008 |
| WO | 2010011390 | 1/2010 |

OTHER PUBLICATIONS

European Search Report, mailed Mar. 5, 2015 in corresponding European Application No. 14 17 4662.

(Continued)

*Primary Examiner* — Cuong Q Nguyen
*Assistant Examiner* — Nishath Yasmeen
(74) *Attorney, Agent, or Firm* — Morris & Kamlay LLP (57) ABSTRACT

Optical components and devices are provided that include a substrate, a microlens array, and a barrier film system conformally covering the microlens array. An OLED may be optically coupled to the microlens array. The barrier film may provide protection to the microlens array or other components, without having a significant negative impact on outcoupling of light from the coupled OLED by the microlens array.

35 Claims, 9 Drawing Sheets

(56) References Cited

U.S. PATENT DOCUMENTS

| | | | |
|---|---|---|---|
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 7,795,807 B2* | 9/2010 | Li | H01L 51/5284 313/498 |
| 7,968,146 B2 | 6/2011 | Wagner et al. | |
| 2003/0230980 A1 | 12/2003 | Forrest et al. | |
| 2004/0174116 A1 | 9/2004 | Lu et al. | |
| 2004/0195960 A1* | 10/2004 | Czeremuszkin | C08J 7/045 313/504 |
| 2008/0157245 A1* | 7/2008 | Jeong | H01L 27/14621 257/432 |
| 2009/0021150 A1* | 1/2009 | Kim | H01L 51/5256 313/504 |
| 2009/0190009 A1* | 7/2009 | Kawasaki | H01L 27/14625 348/249 |
| 2009/0302744 A1* | 12/2009 | Kim | H01L 51/5275 313/504 |
| 2009/0304909 A1* | 12/2009 | Daniels | H01L 27/14627 427/66 |
| 2010/0084677 A1* | 4/2010 | Michellys | H01L 51/5262 257/98 |
| 2010/0193818 A1* | 8/2010 | Krummacher | H01L 51/5275 257/98 |
| 2011/0031514 A1* | 2/2011 | Sakaguchi | H01L 51/5275 257/88 |
| 2011/0111018 A1* | 5/2011 | Ashraf | A61K 9/2027 424/452 |
| 2011/0221018 A1* | 9/2011 | Shi | B81B 7/007 257/432 |
| 2011/0241051 A1 | 10/2011 | Carter et al. | |
| 2012/0027984 A1 | 2/2012 | Wagner et al. | |
| 2012/0146885 A1* | 6/2012 | Jung | G02B 27/2278 345/6 |
| 2014/0170787 A1 | 6/2014 | Burrows et al. | |

OTHER PUBLICATIONS

Second Office Action for CN 201410270339.3, including translation, dated Jun. 21, 2017.

Baldo, et al., "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, vol. 75, No. 1, pp. 4-6, Jul. 5, 1999.

European Search Report, dated Mar. 5, 2015 in corresponding European Application No. 14 17 4662.

* cited by examiner

BARRIER COVERED MICROLENS FILMS

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs) and, more specifically, to OLEDs that incorporate microlens layers covered by a barrier film.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

The present invention provides optical components and devices that include a substrate, a microlens array (MLA), and a barrier film system conformally covering the microlens array. An OLED may be optically coupled to the MLA, and may be disposed over or below the substrate. The OLED may be flexible, transparent, top-emitting, bottom-emitting, or any combination thereof. The barrier film may have a refractive index within about 10% of an index of refraction of an outcoupling surface of the OLED and/or the MLA. The barrier film may be deposited to cover one or more sides of the substrate and/or the MLA, and may fully surround the substrate and/or the MLA. The MLA may be conformal to the barrier film; for example, the combined exposed height of the microlens array and the barrier film may be not more than 10% different from the height of the microlens array alone. The barrier film may a single-layer barrier, and may include materials such as nitrides, oxides, silicon oxide, and the like.

Techniques for fabricating the devices disclosed herein may include obtaining a microlens array and depositing a barrier film material over the microlens array to form a barrier film in conformal contact with the microlens array. Other layers may be deposited before or after the barrier film. More generally, the devices disclosed herein may be fabricated by depositing the layers shown and described in order.

BRIEF DESCRIPTION OF THE DRAWINGS

FIG. 9(a) shows light outcoupling as the fraction of light introduced by an OLED into a substrate that is outcoupled to air; the corresponding structure is shown in FIG. 9(b) according to an embodiment of the invention.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
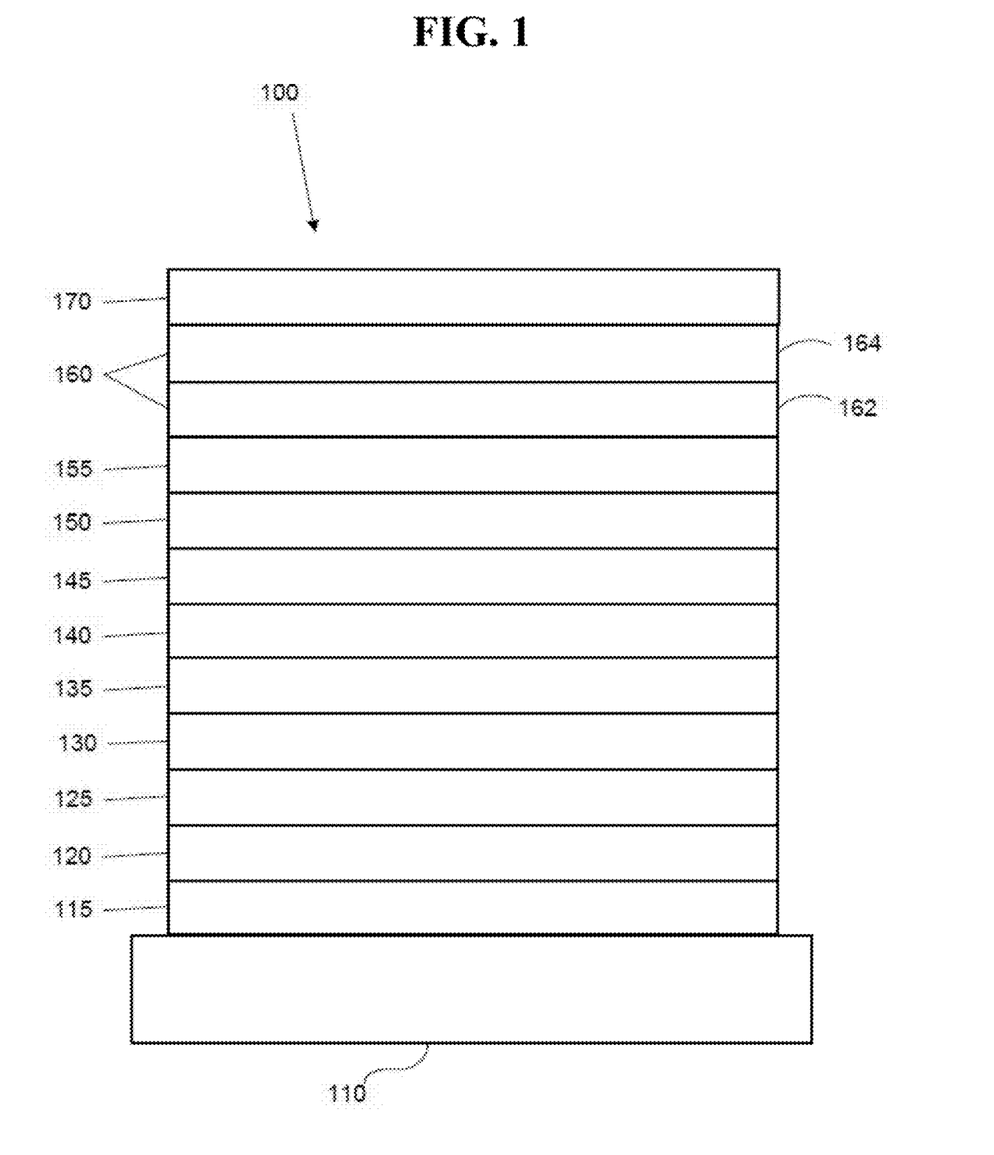
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
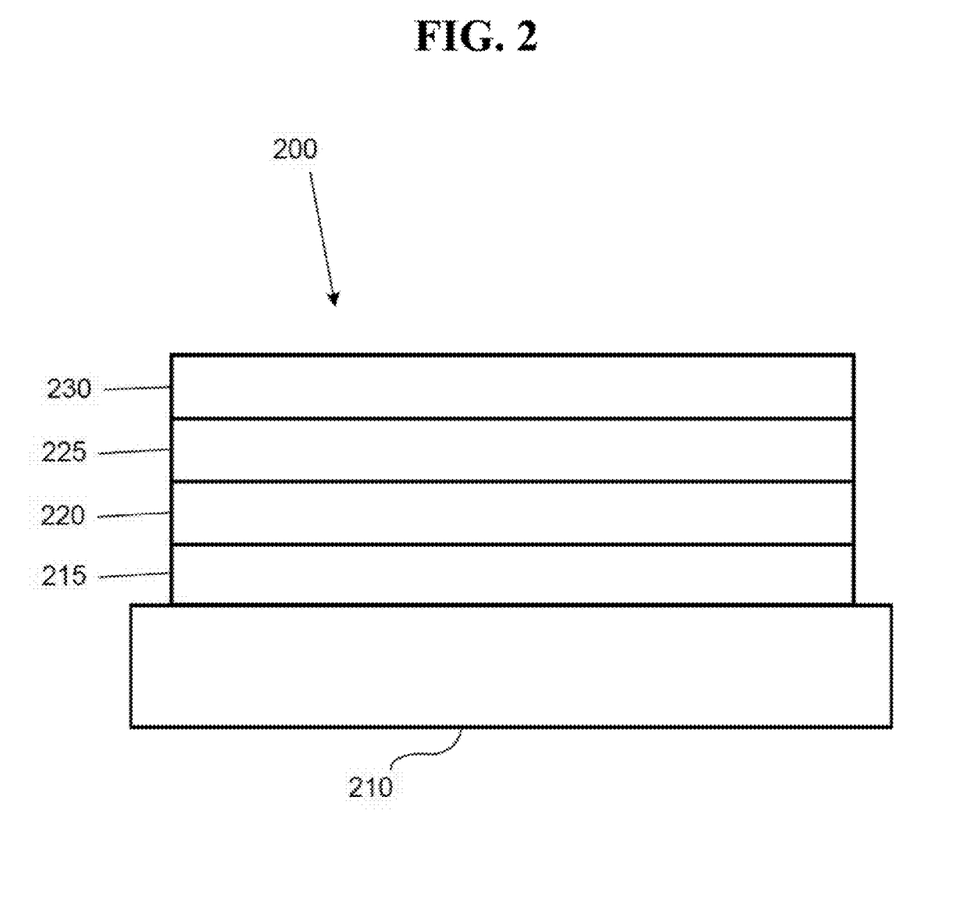
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

Microlens arrays (MLAs) often are an effective way to extract wave-guide light from OLED devices. Typically an MLA is made on a transparent plastic film, which may not have acceptable or high-performance barrier properties. The present disclosure provides structures for use in OLEDs that incorporate MLAs with a barrier coating that doesn't compromise the optical performance, in particular the light-extraction performance of the MLA and/or the OLED as a whole. More specifically, embodiments disclosed herein provide an optical component that includes a substrate, a microlens array disposed over the substrate, and a barrier film that conformally covers the microlens array.

Figure 3:
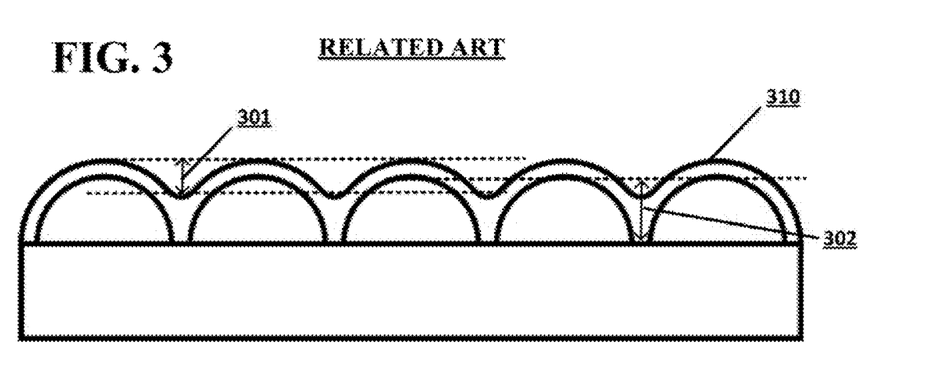
FIG. 3 shows a multi-layer thin film barrier using flowable materials.

In contrast to other surfaces and layers with which barrier layers may be used, an MLA feature typically cannot be altered by the film, because alterations may be likely to compromise the light extraction performance of the MLA. In a conventional multi-layer barrier film, alternate inorganic and organic polymer coatings typically are used. The polymer layers are formed by polymerizing a precursor material, which typically is in the liquid form. When placed on non-smooth surfaces, the liquid precursor is more likely to flow to the low valleys rather than stay at high peaks. Such a material is referred to as a "flow-able" material. Air bubbles and uneven wetting also may cause problems when a flow-able material is deposited on an uneven surface. Thus, a multi-layer thin film barrier using flow-able materials may not be suitable to provide barrier to an MLA surface, because the flow-able material will accumulate in the valleys of the lens features resulting a much smoother surface profile, as shown in FIG. 3. When the coating thickness is comparable to lens feature height, for example, within 90% of the lens height, the lens shape may be effectively lost and the optical performance of the film may be significantly compromised.

In embodiments of the present invention, non-flow-able barrier materials are used to conformally coat an MLA structure. An example of such a barrier process is described in U.S. Pat. No. 7,968,146, the disclosure of which is incorporated by reference in its entirety. Examples of suitable material for the barrier films disclosed herein include polymeric materials, such as silicone polymers, and various types of non-polymeric materials, such as silicon oxides, as well as any other suitable materials as disclosed in U.S. Pat. No. 7,968,146. Such a barrier film may be deposited, for example, in a single-chamber CVD system, and may use a consistent precursor, such as a siloxane, throughout the film deposition process. The barrier has a hybrid nature, being partly oxide-like and partly polymer-like. Both are intimately mixed at the molecular level, thus making the film a hybrid film instead of a multilayer film.

Figure 4:
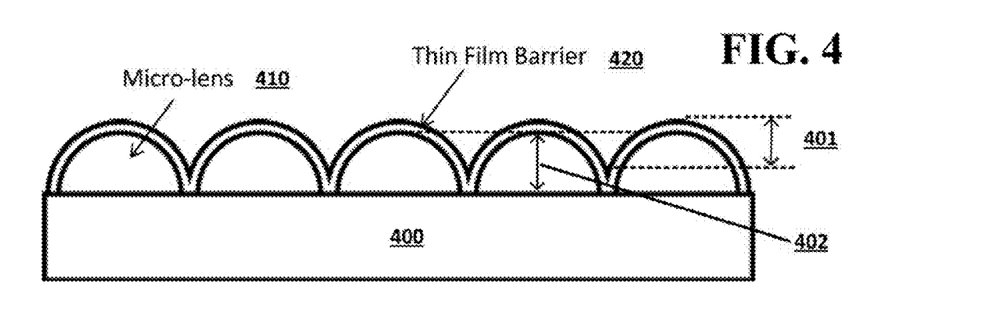
FIG. 4 shows an example component according to an embodiment of the invention.

FIG. 4 shows an example optical component according to an embodiment of the device. The component includes a substrate 400, a microlens array layer (MLA) 410, and a thin film barrier 420 conformally disposed over the MLA. As used herein, the barrier film 420 is "conformally" disposed over the MLA if the contour of the barrier film substantially or exactly matches the contour of the MLA and/or any other layers or structures disposed below the barrier film. For example, comparing the film 310 in FIG. 3 to the barrier film 420 of FIG. 4, it can be seen that the surface contour of the film 310 is substantially different than the surface contour of the underlying MLA, due to the "smoothing out" of the areas between adjacent lens structures in the MLA by the film 310. In contrast, the barrier film 420 in FIG. 4 has substantially the same surface contour as the underlying MLA layer 410. One way to determine to what degree a layer conformally coats another is to compare the relative heights of the layers alone which, in the case of a barrier film or similar layer, is equivalent to comparing the relative height of the underlying layer to the combined height of the underlying layer and the barrier film, measured from lowest to highest exposed points of the barrier film.

In the case of a non-conformal layer such as 310, the height 301 of the layer measured from the lowest exposed surface to the highest exposed surface is considerably less than the height 302 of the underlying MLA alone, i.e., in the absence of the film 310 before the film 310 is disposed over the MLA. In contrast, the height 401 of the barrier film, measured from the lowest to the highest exposed surface relative to the substrate, is substantially the same as the maximum height 402 of the MLA measured from the substrate. It may be preferred for the height 401 of the barrier film disposed over the MLA to be at least 90% the height of the MLA 402, or not more than 10% different than the height of the MLA 402.

Figure 5:
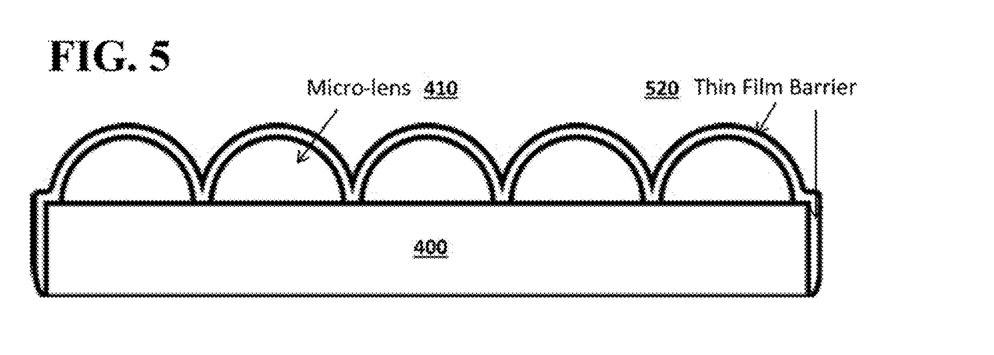
FIG. 5 shows an example component according to an embodiment of the invention.
Figure 6:
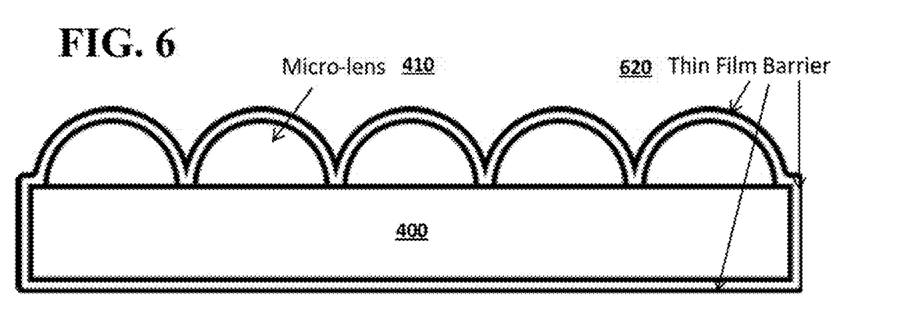
FIG. 6 shows an example component according to an embodiment of the invention.

The barrier film may cover only a portion of the MLA, such as where it is disposed over the MLA itself as shown in FIG. 4, or it may cover additional portions of the optical component. For example, FIG. 5 shows an example optical component in which the barrier film 520 covers the MLA as well as at least one side of the MLA and at least one side of the substrate 400. Similarly, as shown in FIG. 6, a barrier film 620 may cover additional portions of the substrate, such as a surface of the substrate opposite the nearest surface of the substrate over which the MLA is disposed. Arrangements such as shown in FIGS. 5 and 6 may be efficiently fabricated, because each part of the barrier film may be deposited at the same time as the barrier film is deposited on the lens surface. Various arrangements in which different portions of the optical component are covered by the barrier film may be useful, for example, to provide protection to other parts of the optical component, and/or to provide protection to or from other parts of a device into which the optical component is integrated. In a configuration such as is shown in FIG. 6, a desiccant may be included inside the barrier envelope, for example between the barrier film and the MLA, to provide extra protection from moisture and oxygen.

Figure 7:
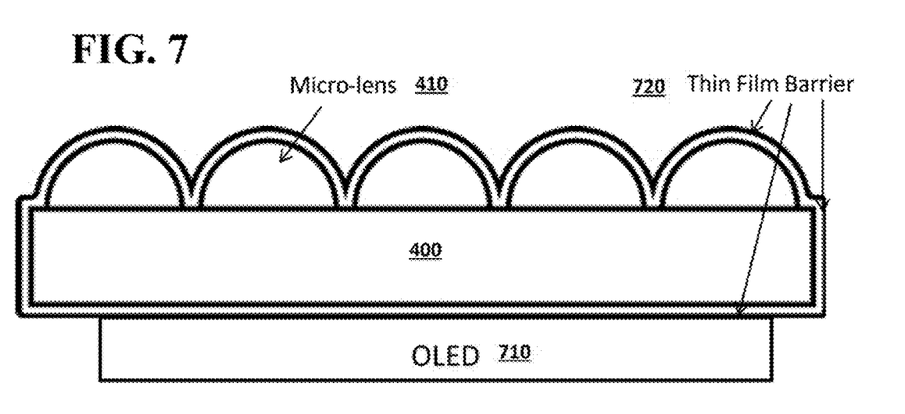
FIG. 7 shows an example component according to an embodiment of the invention.

In some embodiments, the optical component may include additional components, such as an OLED. The OLED may be disposed immediately adjacent to the substrate and/or covered by a barrier film, or it may be disposed outside the barrier film, such that at least a portion of the barrier film is disposed between the OLED and the substrate, and/or between the OLED and one or more other layers or components of the optical component. FIG. 7 shows an example device in which the barrier film 720 is disposed between the substrate 400 and the OLED 710. More generally, the OLED may be coupled to the top or bottom of the substrate, i.e., on the same side of the substrate as the MLA layer or on the opposite side, respectively. Additional layers may be present between the barrier film 720 and the OLED 710, such as a light extraction layer.

In addition to the barrier property, the coating layer can provide an extra benefit in reducing the reflection at the interface, especially when the refractive index of the barrier film is equal to, or not more than, a refractive index of the MLA. More generally, in embodiments of the invention, barrier films may be used that do not degrade the outcoupling performance of the MLA. A description and model of this benefit is provided in further detail below. It may be preferred for the barrier film to have an index of refraction within about 10% the index of refraction of an outcoupling surface of the OLED, the MLA, or both.

Various substrates and substrate materials may be used. For example, a plastic substrate, which may be entirely or partially transparent and/or flexible, may be used; examples of suitable plastic substrate materials include polyethylene, polypropylene (PP), polystyrene (PS), poly ethylene terephthalate (PET), polyethersulfone (PES), polyethylene naphthalate (PEN), polyimide, polycarbonates (PC), and the like. The substrate may have a refractive index of at least 1.6 in the direction of the plane of the substrate, though other materials may be used.

The optical components disclosed herein can be used to extract light from OLED devices. To do so, a barrier coated MLA may be optically coupled to an OLED device. For example, an OLED may be disposed in physical contact with the barrier-coated MLA substrate, such as is illustrated in and described with respect to FIG. 7. The barrier may be applied to the MLA before or after the OLED is deposited. For example, an OLED may be built on the side of a MLA substrate opposite to the MLA surface. Thin film barrier layers also may be applied to the top of the OLED followed by the MLA surface side, or the barrier film may be applied to both side simultaneously. Although FIG. 7 uses the general structure shown in FIG. 6, structures such as those shown in FIGS. 4 and 5 also may be used.

As another example, a transparent adhesive material may be used to couple an OLED with a barrier-coated MLA. As previously described, the OLED may be built on other substrate materials, and the adhesive used to couple the substrate to the MLA film.

Figure 8:
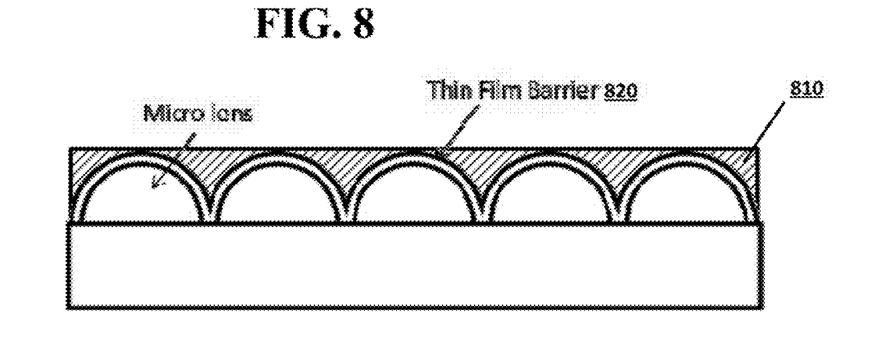
FIG. 8 shows an example component according to an embodiment of the invention.

Additional barriers other than those specifically illustrated also may be applied, for example to protect the OLED from the opposite side of the barrier-coated MLA. Furthermore, an OELD device coupled with a barrier coated MLA, such as illustrated in FIG. 7, may be enclosed further by one or more barrier coated planar films for additional protection. An example of such a device is shown in FIG. 8, in which a planar film 810 is disposed over the barrier film 820.

As used herein, a "microlens array" may include arrays having microlenses of various shapes and configurations. Individual lenses of the array may be spherical, meaning that the lens surface has constant curvature. For example, such a microlens array may include an array of raised hemispheres on a planar substrate surface. Alternately, the microlenses in an array can be aspheric. The surface of an aspheric lens is radially symmetric about an axis normal to the plane of the substrate, but has varying curvature. Microlenses can be arranged in randomly or in repeating patterns on a substrate. The microlenses in an array may be of uniform size, of two or more discrete sizes, or they may have randomly varying size. A faceted microlens array includes structures bounded by flat facets. Facets may repeat along one axis in the plane of the substrate. Facets may also repeat along two or more axes to form polyhedral structures such as pyramids and frustra. A convoluted microlens includes a curved surface feature without axial symmetry. An array of convoluted microlenses has surface topography that is periodic with respect to one or more axes, i.e. corrugated or dimpled "egg crate" surfaces. Another type of microlens, referred to as irregular, includes a topographical feature on the substrate with an arbitrary shape. Such features may have concave, convex, or faceted surfaces, or any combination thereof. A surface diffuser includes an array of randomly-positioned and/or randomly-sized irregular microlenses. An illustrative example of such an array is shown on page 4 of the "Capabilities" brochure from Luminit (Torrance, Calif.), available at http://www.luminitco.com/files/u1/Luminit_CapBroch_F3_9_12_lo.pdf. The size of an individual lens typically is smaller than the overall OLED device, and comparable or larger than the wavelength of light to be extracted.

Generally, the optical components disclosed herein may be fabricated by obtaining a microlens array, and depositing a barrier film material as disclosed herein over the microlens array to form a barrier film in conformal contact with the array. Other layers may be deposed before or after the barrier film, such as disclosed with respect to FIGS. 1 and 2.

Experimental and Modeling

In addition to the barrier properties previously described, a barrier film layer may provide an additional benefit by reducing the reflection at the interface, especially when the MLA structure has a higher refractive index than that of the coating material.

The reflection loss $R_{12}$ at the interface between $n_1$ and $n_2$, for a normally incident light, is equal to $$R_{12}=(n_1-n_2)^2/(n_1+n_2)^2$$

In the case of $n_1$=1.7 and $n_2$=1.0 (air), the loss is 6.7%.

When a third material with an index of $n_3$ where $n_1 > n_3 > n_2$ is used, the reflection loss can be estimated as $$R_{132}=(n_1-n_3)^2/(n_1+n_3)^2+(n_3-n_2)^2/(n_3+n_2)^2$$

The assumption in the above equation is that the loss is small at the first interface. For a barrier film according to the experiment disclosed herein, the refractive index is about 1.46. When such barrier is used as the coating material on top of MLA with an index of 1.7, the reflection loss is reduced to 4.1%.

According to the above theory, a coating with refractive index higher than that of substrate will significantly increase the loss due to reflection. This model only considers the simple case of reflection loss at normal incidence.

To account for all the important factors including the light extraction impact, further modeling was performed. The results suggest that placing a low index coating over a microlens array may decrease the efficiency with which it outcouples light from the substrate. The case of a 1 μm conformal coating covering an array of microlenses and the planar regions between them was considered. Outcoupling was optimal for the case where the index of refraction of the coating $n_c$=1 and the case where $n_c$=$n_{sub}$, with $n_{sub}$ being the index of refraction of the substrate and microlenses. The coating is absent in the $n_c$=1 case. The presence of the coating was found to slightly enlarge the microlenses in the $n_c$=$n_{sub}$ case, with no other optical effect. Outcoupling was found to reach a local minimum midway between the $n_c$=1 and $n_c$=$n_{sub}$ cases. The outcoupling efficiency was found to fall off rapidly for $n_c$>$n_{sub}$.

Figure 9:
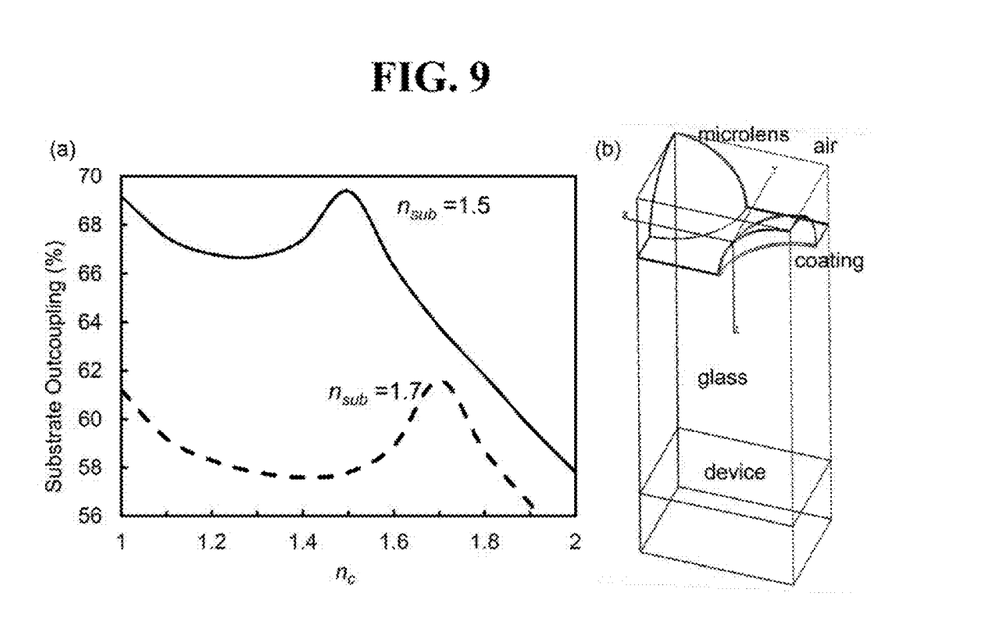

These results were obtained using a ray tracing model that considers only the geometry, refractive index, and reflectivity of modeled components. Wavelength dependent effects such as thin film interference were absent. The outcoupling shown in FIG. 9(a) is expressed as the fraction of light introduced by an OLED into a substrate that is outcoupled to air; the corresponding structure is shown in FIG. 9(b). A hexagonal array of microlenses is modeled using a rectangular cell to represent a unit of surface area. Each cell extends from the OLED layers to the top of a substrate with index matched microlenses. Vertical walls are perfectly reflective symmetry boundary conditions. A small volume of air (n=1) is present at the top of the cell so that light refracted at a wide angle can be handled by the symmetry boundary conditions. Light enters the bottom of the substrate in a Lambertian distribution. The device layers act as an 80% reflective mirror for incident light. A thin conformal coating surrounds the microlenses and substrate. $n_c$ is varied from 1 to 2 for two different values of $n_{sub}$. $n_{sub}=1.5$ corresponds to soda lime glass and most common plastic. $n_{sub}=1.7$ treats the case of a substrate index matched to the OLED layers.

Figure 10:
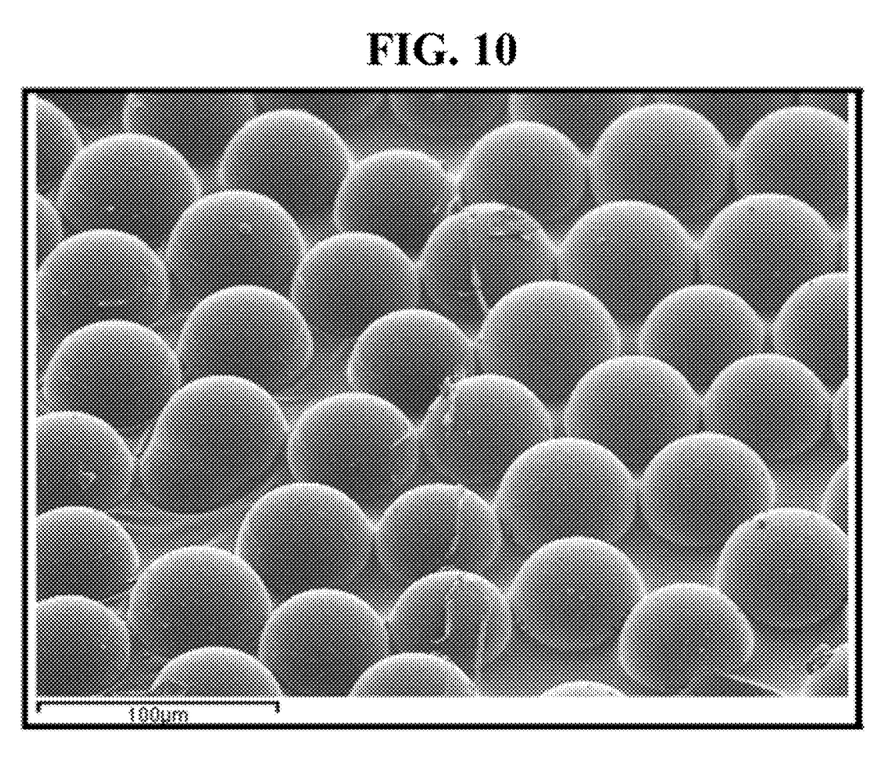
FIG. 10 shows an example SEM image of a sample according to an embodiment of the invention, when viewed at an angle.
Figure 11:
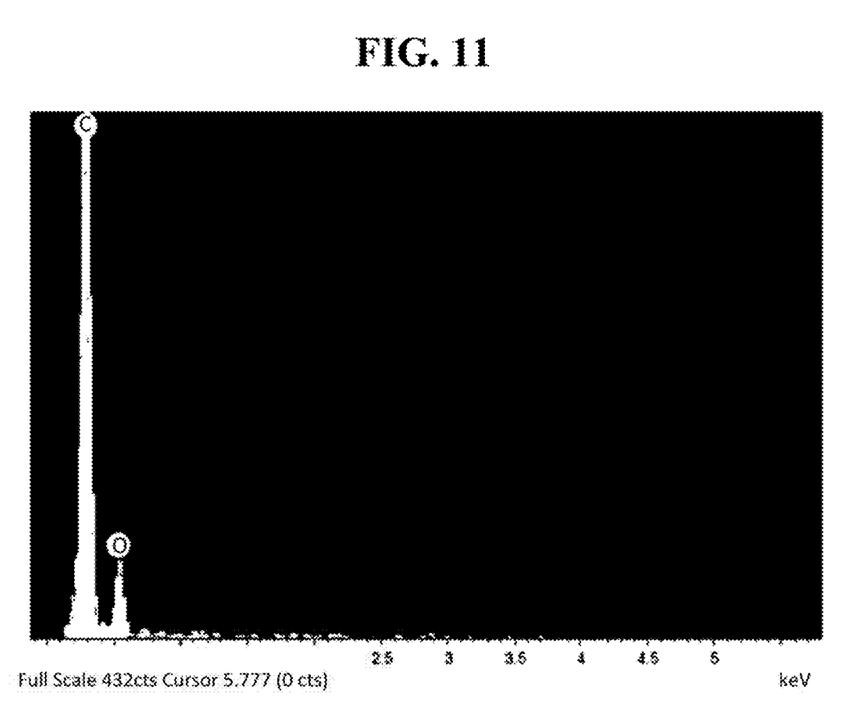
FIG. 11 shows energy dispersive x-ray spectroscopy (EDS) measurements of the substrate with a barrier using a device according to an embodiment of the invention.
Figure 12:
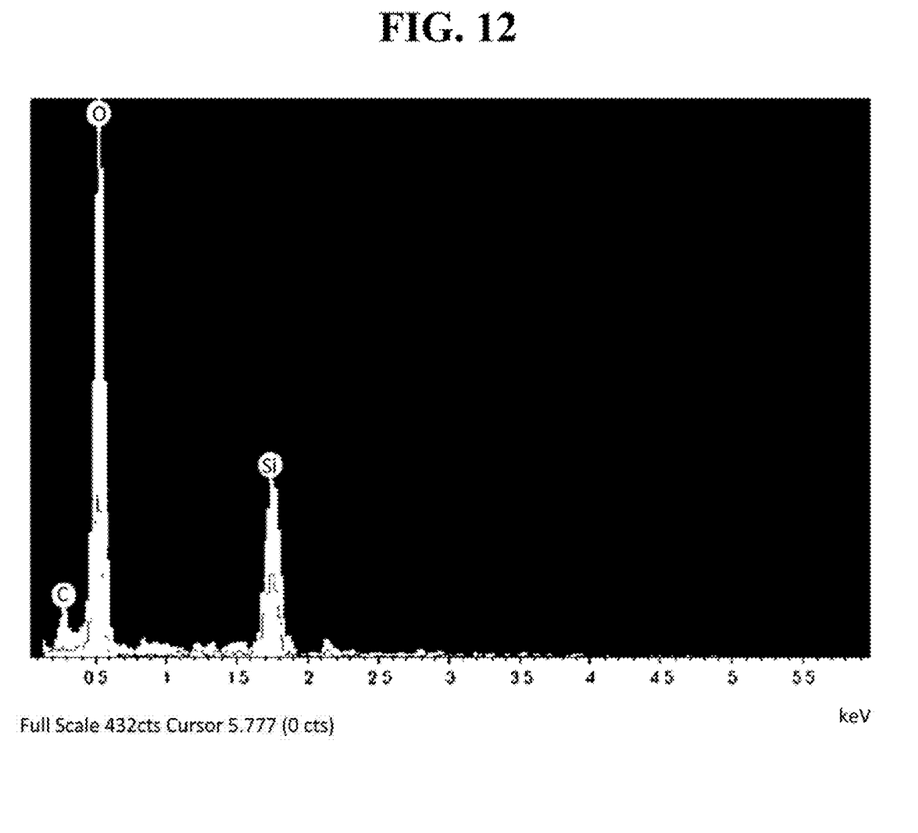
FIG. 12 shows energy dispersive x-ray spectroscopy (EDS) measurements of the substrate without a barrier using a device according to an embodiment of the invention.

An example optical component was fabricated as disclosed herein. A hybrid barrier was deposited on top of a microlens array film and SEM pictures were taken to study the coverage. In this experiment, Kapton tape was used to cover a portion of the MLA surface to allow for side-by-side comparison between the un-coated and coated regions. FIG. 10 shows a SEM image of the sample viewed at an angle. The right half of the sample was coated with the barrier and the left half was covered with tape so the barrier was not deposited on the MLA surface. After the coating process was done, the tape was removed leaving a trace in the center of the sample, as shown in FIG. 10. An individual lens has a diameter of roughly 50 μm. As shown from the right side of the image, the MLA was uniformly coated with a smooth barrier layer with the lens shape well preserved. An Energy Dispersive X-Ray Spectroscopy (EDS) analysis was conducted to study the composition of the material. The results showed that the left side is mainly carbon from the microlens plastic (FIG. 11) and the right side has a strong Si presence (FIG. 12) which is the main composition element in the barrier film. EDS data shows that the right half of the lenses are covered by the barrier material.

Figure 13:
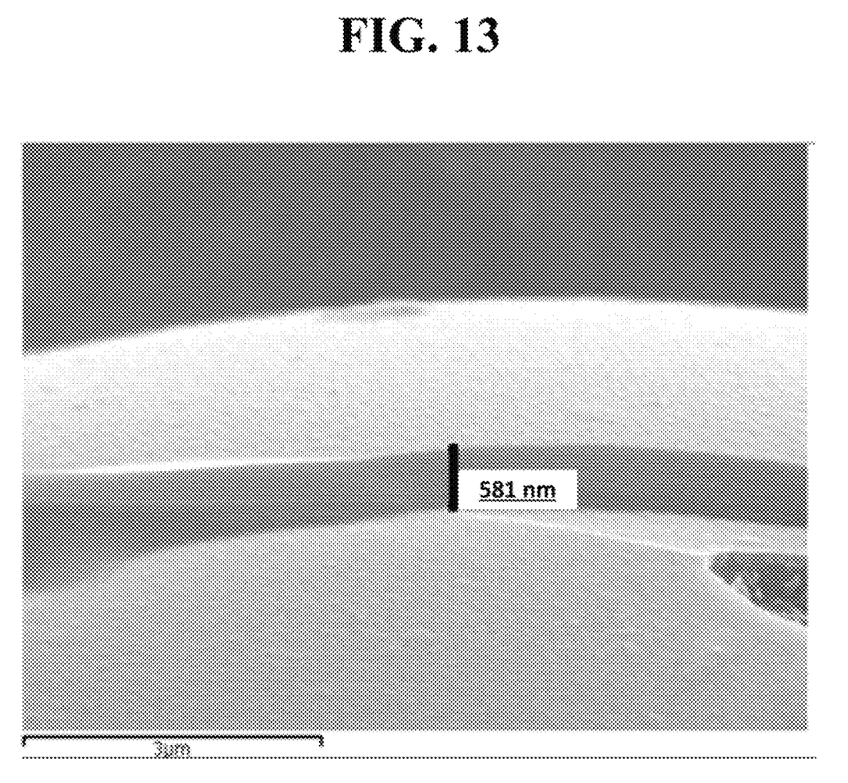
FIG. 13 shows a close-up photograph of a component according to an embodiment of the invention.

Since Kapton tape was used and the surface of the MLA is not flat, the boundary between coated and uncoated regions is not sharp. FIG. 13 shows one segment with a clear view of the coating on top of the MLA surface. The thickness of the coating was measured to be 581 nm.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device comprising:
   an optical component comprising:
   a substrate;
   a microlens array disposed over the substrate; and
   a barrier film system conformally covering the microlens array, at least one side surface of the substrate, and at least a portion of a surface of the substrate under the microlens array.

2. The device of claim 1, further comprising an OLED optically coupled to the microlens array.

3. The device of claim 2, wherein the OLED is disposed over the substrate and over the microlens array.

4. The device of claim 2, wherein the OLED is disposed below the substrate.

5. The device of claim 2, wherein the barrier film has an index of refraction within about 10% of an index of refraction of an outcoupling surface of the OLED.

6. The device of claim 2, wherein the OLED comprises a flexible OLED.

7. The device of claim 2, further comprising a light extraction layer disposed between the OLED and the barrier film.

8. The device of claim 1, wherein at least a portion of the barrier film is disposed between the OLED and the microlens array.

9. The device of claim 1, wherein the barrier film has an index of refraction within about 10% of an index of refraction of the microlens array.

10. The device of claim 1, wherein the barrier film has an index of refraction not more than an index of refraction of the microlens array.

11. The device of claim 1, wherein the barrier film further covers at least one side of the microlens array.

12. The device of claim 1, wherein the barrier film fully surrounds the microlens array.

13. The device of claim 1, wherein the combined exposed height of the microlens array and the barrier film is not more than 10% different from the height of the micro lens array alone.

14. The device of claim 1, wherein the barrier film is a single-layer barrier.

15. The device of claim 1, wherein the barrier film comprises a mixture of polymeric material and non-polymeric material.

16. The device of claim 1, further comprising a barrier coated planar film disposed over the barrier film.

17. The device of claim 1, wherein the substrate is flexible.

18. The device of claim 1, wherein the substrate comprises a material having a refractive index of at least 1.6 in the direction of the plane of the substrate.

19. The device of claim 1, wherein the substrate comprises a plastic material selected from the group consisting of: polyethylene, polypropylene (PP), polystyrene (PS), poly ethylene terephthalate (PET), polyethersulfone (PES), polyethylene naphthalate (PEN), polyimide.

20. The device of claim 1, wherein the barrier film comprises a material type selected from the group consisting of: a nitride, and an oxide.

21. The device of claim 1, wherein the barrier film comprises silicon oxide.

22. The device of claim 1, wherein the barrier film comprises a silicon polymer.

23. The device of claim 1, wherein the substrate is transparent.

24. The device of claim 1, wherein the optical component is transparent.

25. The device of claim 1, wherein the microlens array comprises at least one microlens having a shape selected from the group consisting of: spherical, aspheric, faceted, convoluted, and irregular.

26. The device of claim 1, wherein the microlens array comprises a plurality of microlenses.

27. The device of claim 26, wherein at least one of the size and shape of the microlenses is uniformly distributed across the microlens array.

28. A method comprising:
obtaining a microlens array; and
depositing a barrier film material over the microlens array to form a barrier film in conformal contact with the microlens array, the barrier film also covering at least one side surface of the substrate and at least a portion of a surface of the substrate under the microlens array.

29. The method of claim 28, wherein the barrier film material is a non-flowable material.

30. The method of claim 28, further comprising:
selecting the barrier film material based on an index of refraction of the barrier film material.

31. The method of claim 30, wherein the barrier film material has an index of refraction not more than an index of refraction of the microlens array.

32. The method of claim 28, further comprising optically coupling an OLED to the micro lens array.

33. The method of claim 32, further comprising disposing the barrier film at least partially between the OLED and the microlens array.

34. The method of claim 28, further comprising depositing the barrier film over at least one other side of the microlens array.

35. The method of claim 28, wherein the barrier film is deposited using chemical vapor deposition CVD and an organosilicon precursor.

* * * * *